(12) United States Patent
Roderick et al.

(10) Patent No.: US 8,203,354 B2
(45) Date of Patent: Jun. 19, 2012

(54) SYSTEM FOR TESTING ELECTRONIC COMPONENTS

(75) Inventors: Ryan B. Roderick, San Jose, CA (US); Ronald D. Kimmel, Fremont, CA (US)

(73) Assignee: Intersil Americas, Inc., Milpitas, CA (US)

( * ) Notice: Subject to any disclaimer, the term of this patent is extended or adjusted under 35 U.S.C. 154(b) by 306 days.

(21) Appl. No.: 12/688,903

(22) Filed: Jan. 17, 2010

(65) Prior Publication Data

US 2011/0074457 A1    Mar. 31, 2011

Related U.S. Application Data

(60) Provisional application No. 61/246,071, filed on Sep. 25, 2009.

(51) Int. Cl.
*G01R 31/00* (2006.01)
(52) U.S. Cl. ......... 324/756.02; 324/756.07; 324/754.09; 324/756.01; 324/756.05
(58) Field of Classification Search ............. 324/754.09, 324/754.18, 756.07
See application file for complete search history.

(56) References Cited

U.S. PATENT DOCUMENTS

| | | | |
|---|---|---|---|
| 4,679,118 A * | 7/1987 | Johnson et al. | 361/718 |
| 5,387,861 A * | 2/1995 | Neiderhofer | 324/750.05 |
| 6,720,783 B2 * | 4/2004 | Satoh et al. | 324/754.08 |
| 7,135,345 B2 * | 11/2006 | Hamren et al. | 438/17 |
| 7,514,946 B2 * | 4/2009 | Soeta et al. | 324/750.09 |
| 7,619,426 B2 * | 11/2009 | Takeshita | 324/756.01 |
| 2003/0122566 A1 * | 7/2003 | Takahashi et al. | 324/760 |
| 2004/0212383 A1 * | 10/2004 | Yanagisawa et al. | 324/755 |
| 2009/0243642 A1 * | 10/2009 | Tsai et al. | 324/756 |

* cited by examiner

*Primary Examiner* — Richard Isla Rodas
(74) *Attorney, Agent, or Firm* — Wallace G. Walter

(57) ABSTRACT

An improved efficiency system for testing electronic components in a motherboard/daughterboard assembly in which the daughterboard is mounted in spaced parallel relationship the to motherboard includes one or more device-under-test socket sub-assemblies having a test socket thereon for receiving a device-under-test and a connector component for disengagable connection to a complementary connector component on the daughterboard with the socket sub-assembly effecting interengagement of the complementary connector component on the daughterboard via an opening in the motherboard to allow ready access to the test socket for temporary installation, testing, and removal of a device-under-test.

15 Claims, 7 Drawing Sheets

SYSTEM FOR TESTING ELECTRONIC COMPONENTS

CROSS-REFERENCE TO RELATED APPLICATION

This application claims the benefit of U.S. Provisional Patent Application No. 61/246,071 filed Sep. 25, 2009 by the inventors herein, the disclosure of which is incorporated herein by reference.

BACKGROUND

The present invention relates to the testing of electronic components, including integrated circuits, temporarily installed on a 'test' printed circuit board that is interfaced with a commercial electronic-component tester machine.

In the manufacture of electronic components, for example, integrated circuits, the integrated circuit is subject to testing at various stages in its manufacturing process. At the wafer level, conductive areas of the various dies are contacted by electrical probes to measure various circuit values and to exercise various parts of the circuitry. In a similar manner, the singulated dice (i.e., after separation from the wafer) are assembled into a post-encapsulated package. The dice and package are subject to additional testing to further guarantee the performance of the part as a single unit.

In some types of testing machines, such as the FLEX semiconductor test system sold by Teradyne, Inc. of North Reading Mass., one or more test sockets are mounted on a universal motherboard that, in turn, is mounted upon a rigid metal support frame with the so-assembled motherboard/support frame mated to a mounting plate that interfaces with the FLEX tester unit. The Teradyne FLEX test system includes resources for applying test DC, AC, digital, analog, mixed digital/analog, and complex signals, etc. to a device under test and for evaluating the respective responses therefrom. Electrical connections between the testing machine and the universal motherboard are often made via multiple spring-biased pogo-type pins or similar moveable contactors. A separate programmed-controlled pick-and-place machine often uses a vacuum wand having an elastomeric suction-type cup to pick an integrated circuit from a supply of non-tested integrated circuits (typically carried in an elongated plastic sleeve) and insert the so-picked integrated circuit into a test socket on the universal motherboard. The so-inserted integrated circuit is held in the test socket for a selected period of time (typically less than 1-second) while the test protocol is executed. If the integrated-circuit-under-test passes its test protocol, the device is transferred by the programmed suction wand to another sleeve for successfully tested devices or, where the device has failed its test, to yet another sleeve for failed devices or devices that do not meet performance specifications.

In the above described system, the relatively expensive universal motherboards are often configured for a specific device and, consequently, the cost of dedicated universal motherboards can be substantial where the number of different types of devices to be tested is large.

SUMMARY

An improved system for testing electronic components on testing machines using a universal motherboard includes a daughterboard for interfacing with the universal motherboard and a device-under-test (DUT) socket sub-assembly that includes a test socket for receiving a device-under-test and a connector component that mates the daughterboard to the device-under-test socket via an opening in the universal motherboard. From an electrical standpoint, the DUT socket sub-assembly connects the integrated circuit to the test hardware circuitry via conductive circuits in the daughterboard and the universal motherboard.

DESCRIPTION OF THE PREFERRED EMBODIMENT

Figure 1:
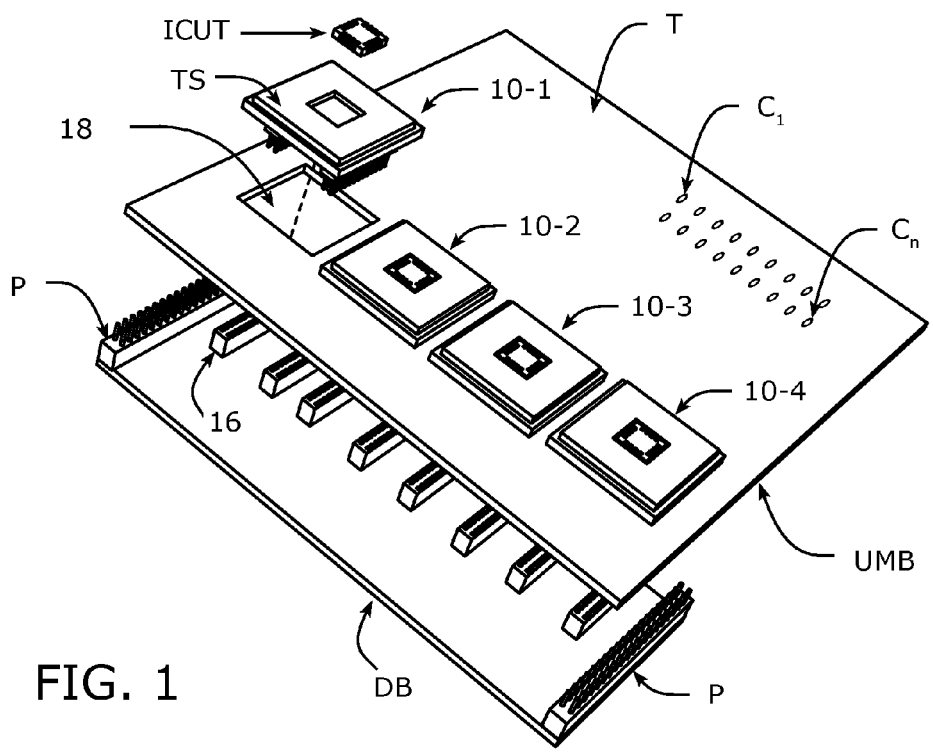
FIG. 1 is an enlarged perspective view of a representative embodiment of a printed circuit board arrangement for the testing of integrated circuits including a universal motherboard, a daughterboard, and a socket sub-assembly for accepting an integrated-circuit-under-test for interconnection to the daughterboard via a "hatchway" or opening in the universal motherboard.
Figure 2:
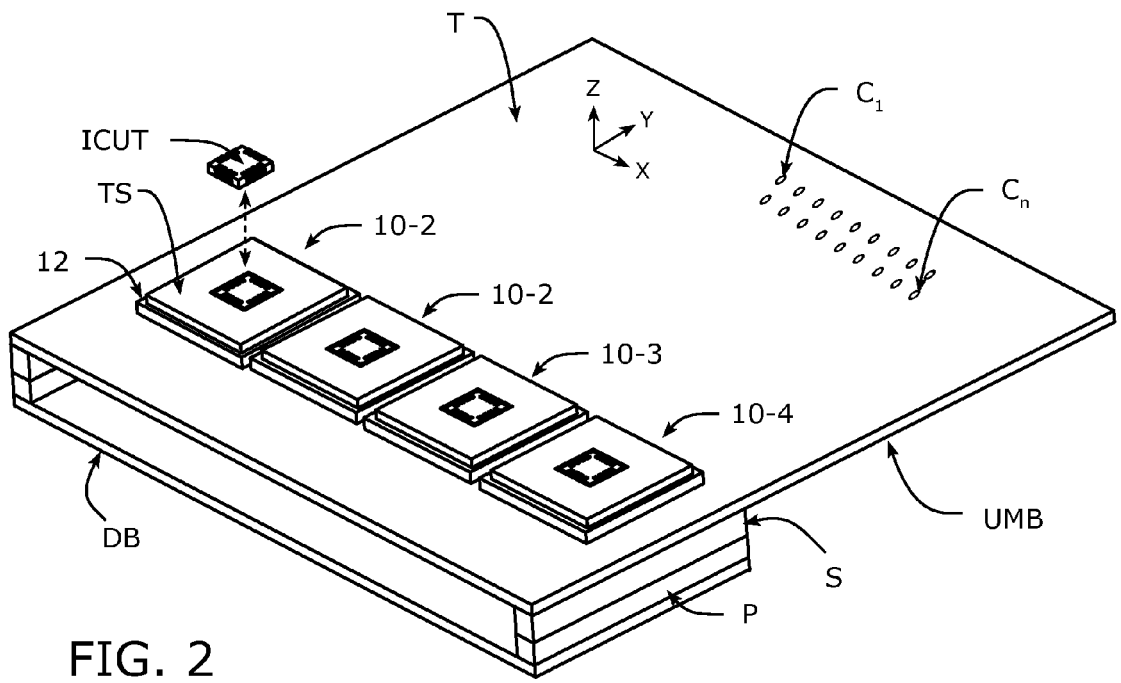
FIG. 2 is a perspective view of the assembled arrangement of FIG. 1 showing the daughterboard and universal motherboard connected to one another with a representative integrated-circuit-under-test displaced from its socket sub-assembly.
Figure 4:
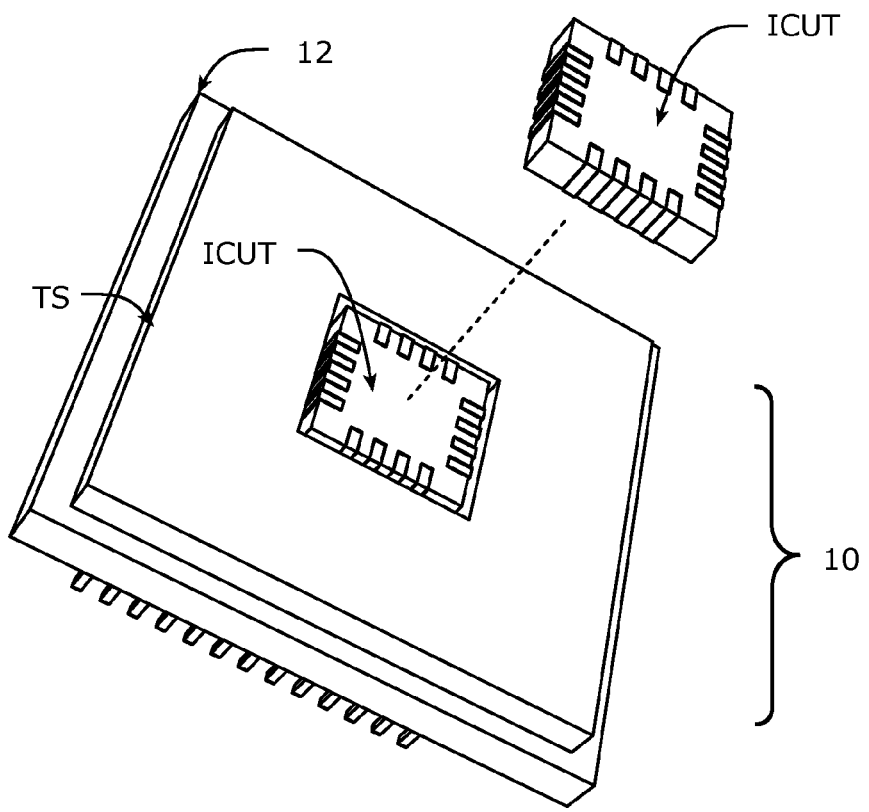
FIG. 4 is an enlarged exploded perspective of a representative socket sub-assembly.
Figure 5:
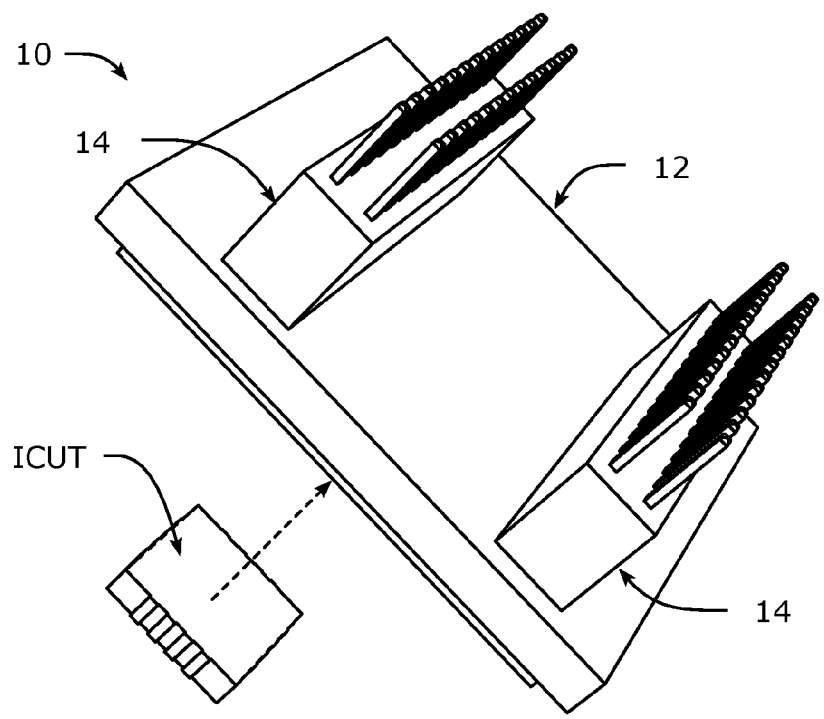
FIG. 5 is an enlarged exploded perspective of the socket sub-assembly of FIG. 4 taken from a different view point from that of FIG. 4.

As shown in the enlarged perspective of FIG. 1 and the assembly view of FIG. 2, an improved organization for the testing of electronic components in systems of the type utilizing a universal motherboard UMB includes a daughterboard DB connected to the universal motherboard UMB by plug P and socket S pairs and a plurality of removable test socket sub-assemblies 10-1, 10-2, 10-3, and 10-4 of the general type shown in FIGS. 4 and 5. In FIGS. 1 and 2, that surface of the universal motherboard UMB designated as "T" represents the top or front side of the universal motherboard UMB and the opposite or obverse side thereof (i.e., that side facing the daughterboard DB) represents the bottom or back side of the universal motherboard UMB. While four socket sub-assemblies 10 are shown as an example, a smaller or larger number of socket sub-assemblies can be used.

The universal motherboard UMB is typically a multi-layer board having numerous contact pads, as represented symbolically by the contacts $C_1 \ldots C_n$, at least some of which are for electrical connection via pogo-type connectors to the testing machine (not shown). The universal motherboard UMB includes electrical traces or pathways on the one or more of the surfaces thereof that define various electrical circuits which may or may not include passive or active electronic devices as a part thereof. Where multilayer boards are used, electrical traces or pathways in the interior thereof connected by vias or vias equivalents constitute the various electrical circuits associated with the universal motherboard UMB. In the case of multilayer boards, the different layers can include, for example, ground planes separating input signal layers and output signal layers, power distribution layers with the attendant conductive traces, vias, and the like to define various electrical circuits. The top and/or bottom side of the universal motherboard UMB can also include various passive or active electronic devices used in the testing protocol as well as contact pads of various types intended for electrical interconnection with the pogo-type contactors of the testing machine or, in some cases, with the daughterboard DB. In general, at least some of the various contracts $C_1 \ldots C_n$ are in-circuit, either directly or indirectly through various passive or active electrical components, with some of the pin-receiving parts of the connector part S.

The daughterboard DB is shown as approximately one-third the surface area of the universal motherboard UMB and as positioned along the lower edge of the universal motherboard UMB; the daughterboard DB can be smaller than or larger than or differently shaped from that shown and can be positioned, for example, at the opposite end of the universal motherboard UMB from the position shown in FIG. 1 or at some mid- or intermediate position or orientation therebetween. In the preferred embodiment, the daughterboard DB is spaced from the bottom surface of the universal motherboard UMB in a stacked-type configuration. In a manner similar to the universal motherboard UMB, the daughterboard DB can be a single or multilayer board with various electrical traces or pathways on one or more of the surfaces thereof and, where multilayer boards are used, electrical traces or pathways in the interior thereof connected by vias or via equivalents that define various electrical circuits which may or may not include passive or active electronic devices. In general, the daughterboard DB circuitry is in-circuit with, either directly or indirectly through various passive or active electrical components, with some or all of the pin-contact parts of the connector part P. Additionally, the daughterboard DB circuitry is in-circuit with, either directly or indirectly through various passive or active electrical components, with some or all of the pin-contact parts of a connector part 16, as described more fully below.

A rigid metal frame (not shown) is attached to or otherwise connected about all or part of the periphery of the universal motherboard UMB and its daughterboard DB to provide a measure of structural rigidity for the transport and handling of the universal motherboard/daughterboard assembly. In general, the design of the testing machine controls the dimensions of the motherboard and the rigid metal frame that supports the universal motherboard/daughterboard assembly.

As shown in FIGS. 4 and 5, the socket sub-assembly 10 includes a conventional test socket TS that is designed to accept an integrated-circuit-under-test ICUT, a generally planar mounting substrate 12, and one or more strip-type plug connectors 14.

Figure 6:
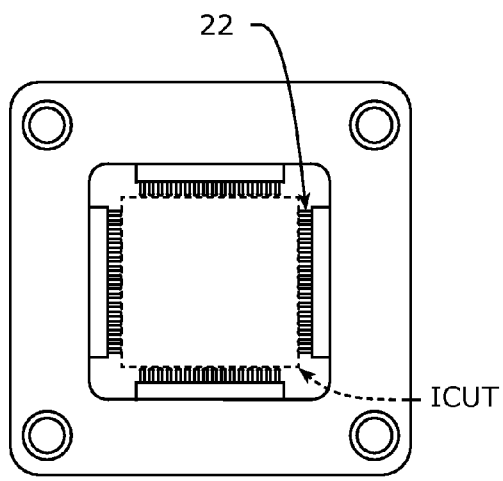
FIG. 6 is a plan view of an exemplary test socket.
Figure 7:
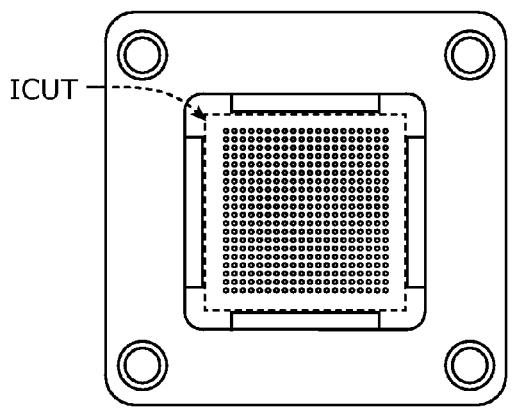
FIG. 7 is a plan view of another exemplary test socket.

The test socket TS shown in FIG. 4 is intended for QFN-16 devices; however, various other types of test sockets for components having different shapes, configurations, and pin-outs are equally suitable. In general, test sockets for QFN-xx devices, as represented by the QFN-54 socket shown in FIG. 6, include resilient spring-like contacts 22 that each effect an electrical connection with the corresponding contact on the device-under-test (DUT) upon insertion of the device into the test socket. Various other types of exemplary test sockets are represented by the BGA type socket shown in FIG. 7; a wide variety of test sockets of various configurations and designs are available from Precision Contacts of El Dorado Hills Calif. While the disclosed exemplary embodiment presents integrated circuits as the device-under-test, the disclosed system is equally suitable for use with discrete components, including signal or switching FETs, lateral or vertical power MOSFETs, inductors, capacitors, substrate-mounted analog packages, and mixed analog/digital circuit packages, etc.

The substrate 12 upon which the test socket TS is mounted is preferably fabricated from the same substrate material from which the universal motherboard UMB and the daughterboard DB are fabricated, although substrates 12 that are thicker or thinner than that of the motherboard and the use of spacers or shims of various thicknesses are not excluded, as discussed below. As in the case of the universal motherboard UMB and the daughterboard DB, the substrate 12 can be a single or multilayer board with various electrical traces or pathways on one or more of the surfaces thereof and, where multilayer boards are used, electrical traces or pathways in the interior thereof connected by vias or via equivalents that define various electrical circuits which may or may not include passive or active electronic devices. In general, the socket module circuitry is in-circuit with, either directly or indirectly through various passive or active electrical components, with some or all of the pin-contact parts of the connector part 14.

The plug connectors 14 are conventional in-line plugs with a plurality of pins (unnumbered) extending therefrom with some or all of the pins thereof are connected to or in-circuit with the conductive circuit traces/pathways and the various contacts 22 in the test socket TS as explained above. The number of pins and the spaced parallel placement of the plug connectors 14 are exemplarily only; the number of plug connectors 14 and their placement and the number of pins are a function of the type of integrated circuit or other device-under-test. While strip-type connectors are preferred, other types of connectors arrangements, including circular plug/sockets are not excluded.

Figure 3:
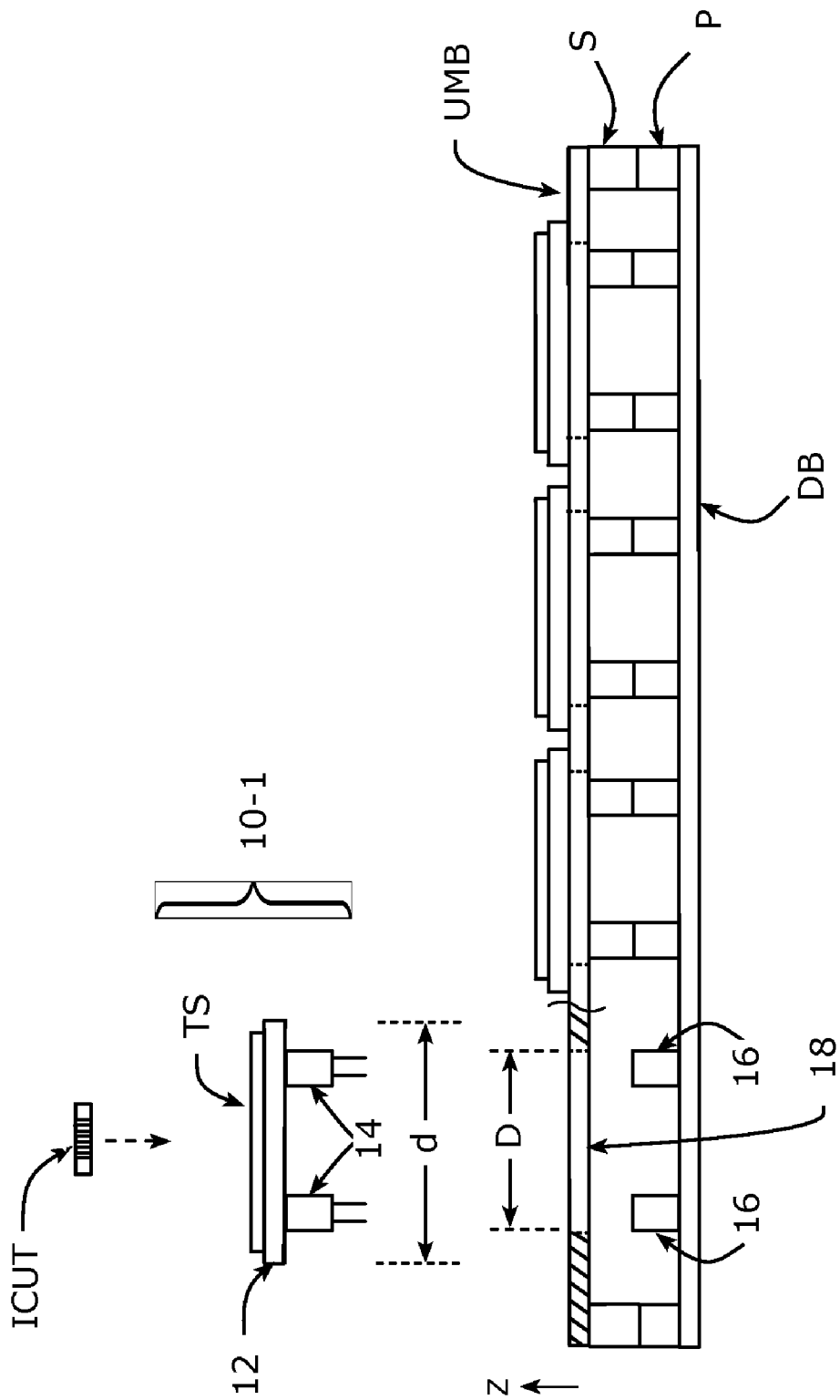
FIG. 3 is an end view of the arrangement of FIG. 2.

As shown in FIGS. 1 and 3, the daughterboard DB is provided with mating socket connectors 16 to receive the pins of the plug connectors 14. The above-described circuitry of the daughterboard DB is in-circuit, either directly or indirectly through various passive or active electrical components, with some or all of the pin-receiving parts of the socket connectors 16.

As also shown in FIGS. 1 and 3, the universal motherboard UMB is provided with appropriately shaped and sized hatchways or openings 18 that extend from the front side to the back side of the universal motherboard UMB and which are defined by or bounded by edges (unnumbered) about the periphery or perimeter thereof. The plug connectors 14 of the socket sub-assemblies 10-1, 10-2, 10-3, and 10-4 can be placed or inserted into its opening 18 to be received by and mated with the corresponding socket connectors 16 (as best shown in FIG. 3) and, conversely, disconnected and removed therefrom. The pin-receiving structures of the various connectors 16 mate with various pins on the plugs P to establish a circuit connection via various conductive traces/vias, etc. with the various contacts 22 of the test socket TS and various corresponding circuits on the daughterboard DB. In the disclosed embodiment, the plug connectors 14 are mounted on the socket sub-assembly 10 while the socket connectors 16 are shown on the daughterboard DB; as can be appreciated, the arrangement can be reversed.

As can be appreciated, the electrical circuit pathways on the universal motherboard UMB, the daughterboard DB, and the socket sub-assembly 10 interconnect via the connector pairs P/S and the connector pairs 14/16 such that all or some of the $C_1 \ldots C_n$ on the universal motherboard UMB with the contacts 22 of the test socket TS.

In general, the shape and sizing of each socket sub-assembly 10 and the shape and sizing of its respective opening 18 are such that the socket sub-assembly 10 can be inserted into the opening 18 in only one orientation to assure proper interengagement of the socket sub-assembly 10 and its socket connectors 16. Additionally and in the embodiment of FIGS. 1-3, the dimensions (as represent by "d" in FIG. 3) of the substrate 12 portion of the socket sub-assembly 10 are sufficiently larger than the corresponding dimension (as represent by "D" in FIG. 3) of the opening 18 to allow one or more edge portions of the socket sub-assembly 10 to overlap the edges of the opening 18 on the top surface of the universal motherboard UMB so that the substrate 12 can to be attached to the top surface of the universal motherboard UMB using one or more threaded fasteners (not shown) and/or one or more spring-type retaining clips or latches (not shown).

In the above described embodiment of FIGS. 1-5, the socket sub-assembly 10 seats, in part, on the top or front surface of the universal motherboard UMB and is installed or removed from the top or front surface thereof.

Figure 8:
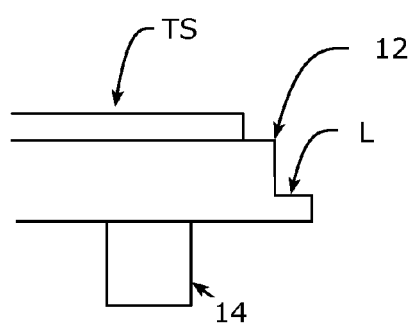
FIG. 8 is detail of a first variant of the socket sub-assembly shown in FIGS. 4-5.
Figure 9:
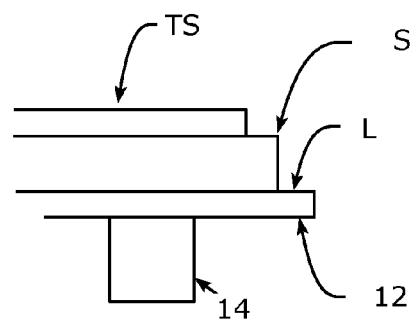
FIG. 9 is detail of a another variant of the socket sub-assembly shown in FIGS. 4-5.
Figure 10:
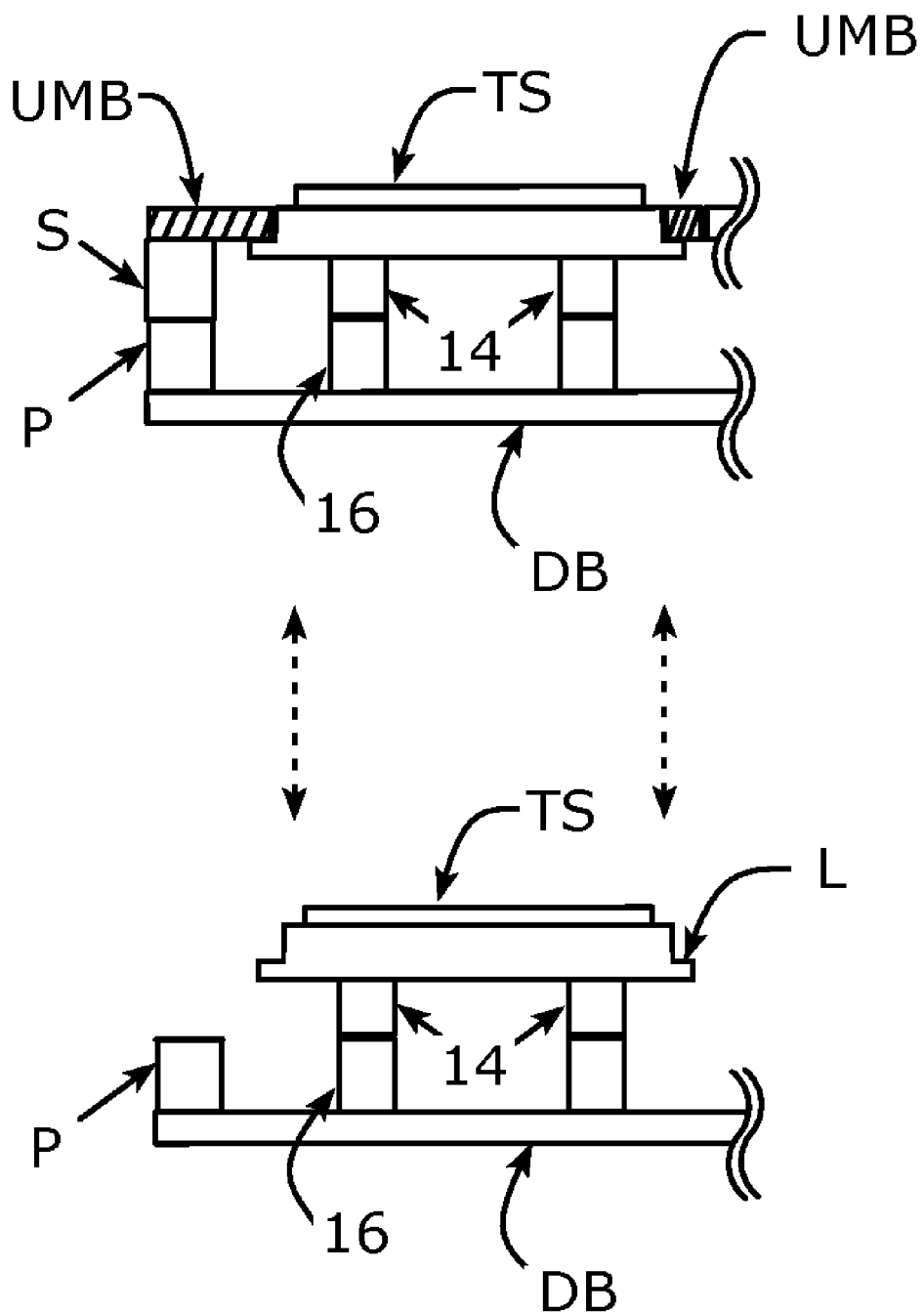
FIG. 10 shows a daughterboard and installed test sockets consistent with the arrangements of FIGS. 8-9.

In contrast to the embodiment of FIGS. 1-5, the embodiment of FIGS. 8-11 seats the socket sub-assembly 10 against the bottom or back side of the universal motherboard UMB. As shown in FIG. 8, substrate 12 is provided with a shoulder or ledge L to engage or bear against the bottom or back underside of the universal motherboard UMB (i.e., the side of the universal motherboard UMB facing the daughterboard DB). The shouldered or stepped substrate 12 can be formed by milling or otherwise machining the ledge L along the edge of a substrate 12 of appropriate thickness or, as shown in FIG. 9, by combining a substrate 12 with a somewhat dimensionally smaller spacer S of appropriate thickness to form a substrate assembly having a shoulder or ledge L about some or all of the periphery thereof. As shown in FIG. 10, the daughterboard DB with the socket sub-assembly 10 can be mounted to the back or bottom side of the universal motherboard UMB with the shoulder or ledge L engaging or seating against the bottom or backside of the universal motherboard UMB so that the socket sub-assembly 10 is 'sandwiched' between the bottom or back side of the universal motherboard UMB and the daughterboard DB. Additionally and if desired, one or more threaded fasteners (not shown) or other type of clips or fasteners can be used to detachably attach the socket sub-assembly 10 to the universal motherboard UMB.

Figure 11:
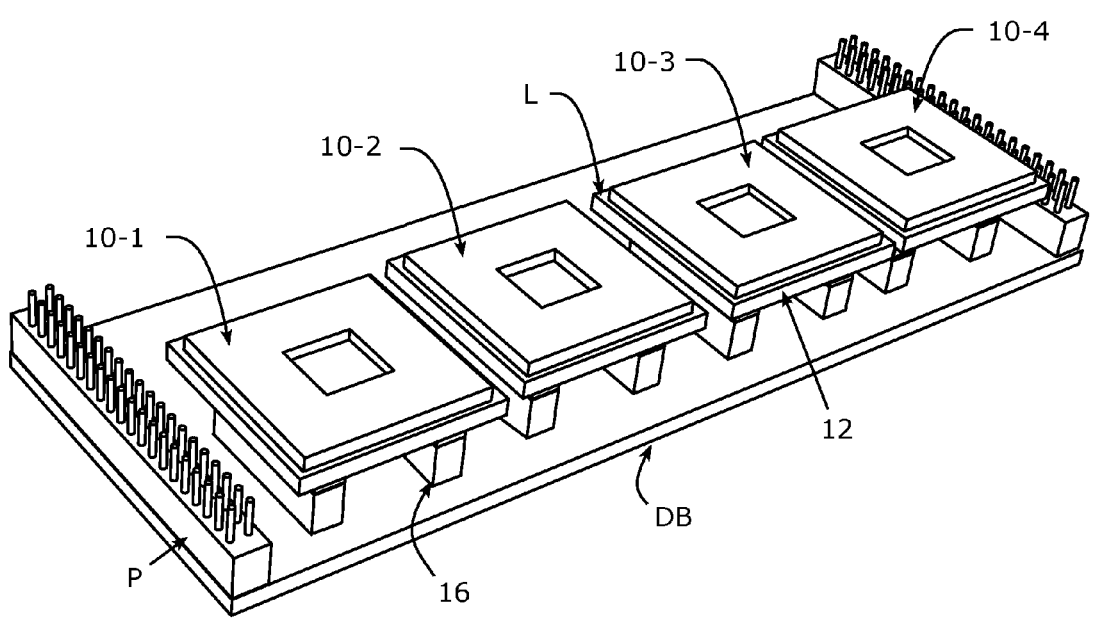
FIG. 11 is a perspective view of a daughterboard with its socket sub-assemblies installed.

As shown in FIG. 11, the daughterboard DB can be "pre-installed" with its socket sub-assemblies 10-1, 10-2, 10-3, and 10-4 of FIGS. 8-10 and then assembled to the back side of the universal motherboard UMB with each socket sub-assembly 10 self-aligning into its respective opening 18 to present its respective test socket TS to the testing machine.

Figure 12:
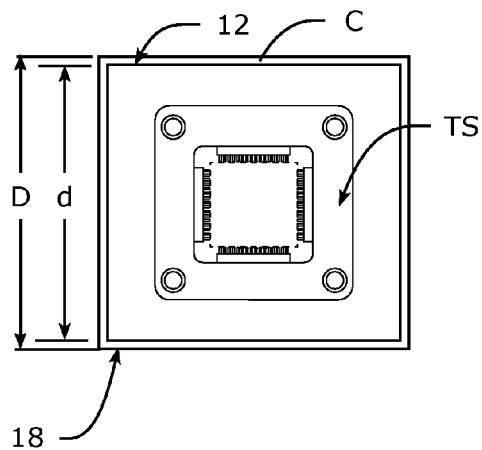
FIG. 12 is a plan view of a socket sub-assembly in position on a universal motherboard showing a clearance dimension between the edges of the socket sub-assembly and an opening in the universal motherboard.
Figure 13:
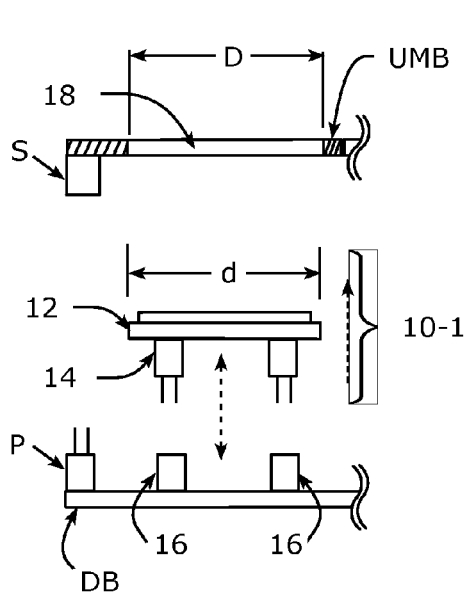
FIG. 13 is an exploded side view of the arrangement of FIG. 12.
Figure 14:
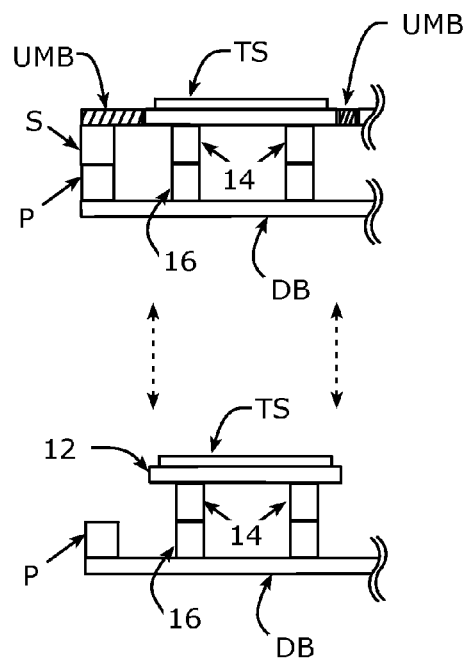
FIG. 14 is an assembly view of the arrangement of FIG. 13.

In a further variant and as shown the plan view of FIG. 12 and the side views of FIGS. 13 and 14, the dimensions "d" of the substrate 12 can be made somewhat smaller than the corresponding dimensions "D" of the opening 18 to provide a small clearance dimension "C" therebetween about the periphery of the substrate 12. As shown in FIG. 13, the socket sub-assembly 10 is aligned with and "plugged" into the daughterboard DB and, as shown in FIG. 14, the daughterboard DB (with its "pre-installed" socket sub-assemblies 10-1, 10-2, 10-3, and 10-4) then assembled to the back side of the universal motherboard UMB with each socket sub-assembly self-aligning into its respective opening 18. If desired, one or more threaded fasteners (not shown) or other type of clip or fastener can be used to detachably attach the socket sub-assembly 10 to the universal motherboard UMB.

In the arrangement of FIGS. 12-14 the socket sub-assemblies 10 can be mated to the universal motherboard UMB from the bottom or back side thereof (as its the case with the embodiment of FIGS. 8-11); however, the arrangement of FIGS. 12-14 also allows the socket sub-assemblies to also be installed from the top or front side of the universal motherboard UMB in a manner consistent with that of the embodiment of FIGS. 1-5

In a typical application of the above-described organizations, a daughterboard DB is fabricated with all or some of the circuitry for testing a particular device-under-test (DUT); the circuitry can include power supply and/or power conditioning circuits, digital and/or analog circuitry, signal generating or conditioning circuits, signal processing/analyzing circuits, and the like. The socket sub-assemblies 10 are assembled with the device-specific test socket TS and, optionally, any additional passive or active electronic devices deemed appropriate for the testing protocol. In the case of the embodiment of FIGS. 1-5, the daughterboard DB is first connected to the universal motherboard UMB by the plugs/sockets P/S and the socket sub-assemblies 10 thereafter inserted through their respective openings 18 to establish electrical connections via the connectors 14/16. In the embodiment of FIGS. 8-11, the socket sub-assemblies 10 are connected to the daughterboard DB via the connectors 14/16 and the daughterboard/socket sub-assembly (FIG. 11) and then mated to the universal motherboard UMB with the test sockets TS positioned in their respective openings 18. In the case of the embodiment of FIGS. 12-14 the procedure of either FIGS. 1-5 or FIGS. 8-14 can be used.

Thereafter, the motherboard/daughterboard assembly is mated to its structurally rigid frame (not shown) and that frame/motherboard/daughterboard assembly mounted on an interface plate (not shown) that, in turn, is mated onto or into the testing machine (not specifically shown), such as a FLEX model test machine from Teradyne, Inc. with the top or front side of the universal motherboard UMB and the test sockets TS facing the interior of the test machine and generally not accessible from the exterior of the testing machine. In the usual case, an array of pogo-type connectors then effects contact with various of the conductive pads on the front surface of the universal motherboard UMB to supply various types of inputs (e.g., DC power, AC power, timing pulses, signals of various types including analog, digital, and mixed analog/digital, etc.) and to remove outputs therefrom. The various voltages, currents, signals, pulse sequences, etc. provided to the universal motherboard UMB via the pogo-type connectors are provided to the daughterboard DB through the connector pairs P/S (FIG. 2) and then to the socket sub-assembly 10 via the connector pair 14/16 and the above-described conductive pathways/traces that or on or in the circuit boards. Conversely, outputs from the device-under-test are likewise provided therefrom to various of the pogo-type contactors via the same or a similar path. As is often the case with these types of testing machines, a vacuum wand or wands under the control of a pick-and-place type machine picks to-be-tested devices from a source of such devices and transports and inserts the to-be-tested devices into a respective test socket TS and holds the devices in place for the duration of the test protocol (typically less than 1-second) and thereafter removes the so-tested device for placement in a "tested-good" device carrier (i.e., a plastic sleeve) or a "tested-bad" destination or a "testednot-good-enough" destination.

The use of removable socket sub-assemblies 10 allows for the replacement thereof as the test sockets TS wear from continued use and allows for the testing of a related family of devices having the same pin-specific functions but different pin-outs by merely replacing the socket sub-assemblies 10 (with the appropriate test sockets TS) as needed. Thus, a daughterboard DB can be provided with circuitry to address testing all members of a related family of devices with different pin-outs by merely changing the socket sub-assemblies 10 having test sockets TS with the pin-out for the appropriate device-under-test.

The embodiments of FIGS. 8-14 allow the assembled daughterboard/test socket to be removed from the bottom or back side of the universal motherboard UMB while the universal motherboard UMB is mounted/mated to the testing machine (not specifically shown) to provide increased operational flexibility relative to the embodiment of FIGS. 1-5, which requires removal of the universal motherboard UMB to gain access to the top or front side thereof to remove and replace the socket sub-assemblies 10.

In general, the various plug/socket pairs are sufficient to maintain the test socket at the correct position in the X,Y plane (FIG. 2) and at the correct position along the Z-axis. If desired, alignment pins and cooperating pilot holes having a line-to-line fit or a small clearance fit can also be used to provide more precise positioning of the test socket TS in the X,Y plane with positioning in the Z direction addressed with substrates of appropriate thickness or a combination of a substrate and one or more spacers or shims of appropriate thickness.

In the description above, the openings 18 are shown as generally square; as can be appreciated, the system is not limited to square or rectilinear shaped openings and can, as desired, use other shapes including circular, elliptical, or combinations of curved and linear shaped openings. Also, the use two-part pin/socket type connectors P/S and 14/16 is merely illustrative; if desired, other types of connector or connector systems are suitable. For example, a contactor arrangement that utilizes an array of pogo-type spring-biased moveable contactors on one of the universal motherboard or the daughterboard to connect to respective contact pads on the other of the universal motherboard or the daughterboard is not excluded; in a similar manner, a contactor arrangement that utilizes an array of pogo-type contactors on one or the other of the socket sub-assembly or the daughterboard to electrically connect to respective contact pads on the other of the daughterboard or the socket sub-assembly is not excluded. In such an arrangement of this type, threaded fasteners and/or various types of clips, etc. (with or without the use of alignment pins and cooperating pilots holes) can be used to mechanically hold the parts together. In the disclosed embodiments, the electrical connectors are described as two-part plug/socket arrangements (i.e., the plug/socket P/S and 14/16) to structurally connect the two boards as well as being in-circuit between the contacts of the test socket TS, the daughterboard DB, and the various contacts $C_1 \ldots C_n$ of the universal motherboard UMB that interface with the pogo-type contactors of the testing machine. As can be appreciated, the combined structural/electrical functions can be separated. For example, one or more standoffs of appropriate height can mechanically connect and separate the two boards from one another with each board attached to the standoff via threaded fasteners. The two boards are then electrically connected via a cable (i.e., a 'flat' ribbon cable) having plugs at both end that connect with sockets on each board or, if preferred, the various wires/conductors of the cable can be solder-connected at one end to contacts on the board with the other end of the cable having a plug thereat that connects to a socket on the other board.

In general, the use of the daughterboard DB/socket sub-assembly 10 in combination with the universal motherboard UMB having the openings described results in a cost saving over the prior systems in which a relatively costly universal motherboard UMB is configured for each specific device-under-test.

As will be apparent to those skilled in the art, various changes and modifications may be made to the illustrated embodiment of the present invention without departing from the spirit and scope of the invention as determined in the appended claims and their legal equivalent.

The invention claimed is:

1. A circuit board organization for the testing of electronic components using a testing machine of the type having plural electrical contactors to at least establish electrical connection with a corresponding plurality of electrical contacts on the circuit board organization to impress electrical test values onto at least some of the plurality of electrical contacts on the circuit board organization and to receive electrical responses from at least some of the plurality of electrical contacts on the circuit board organization, comprising,
   a first printed circuit board having a front side and a back side and having at least one opening there through from the front side to the back side, the opening circumscribing a selected area, a plurality of electrical contacts on at least the front side of said first printed circuit board thereof for receiving respective electrical contactors of a testing machine for establishing electrical connection therebetween;
   a second printed circuit board detachably attached to at least a portion of the back side of said first printed circuit board such that at least a surface area of said second printed board is accessible through said at least one opening of said first printed circuit board, said second printed circuit board having electrical contacts thereon in-circuit with at least some of said plurality of electrical contacts of said first printed circuit board via electrical pathways therebetween;
   a socket module having a test socket thereon for receiving a device-under-test, the test socket having plural electrical contacts for establishing an electrical connection with corresponding electrical contacts on a device-under-test when a device-under-test is electrically mated therewith; and
   means for electrically connecting at least some of the plural electrical contacts of said test socket with at least some of said electrical contacts of said second printed circuit board through said opening in said first printed circuit board whereby any electrical test values impressed onto at least some of the plurality of electrical contacts on the first printed circuit board are electrically conducted to at least some of said plural electrical contacts of said test socket and whereby electrical responses provided to at least some of said plural electrical contacts of said test socket are conducted to at least some of the plurality of electrical contacts on the first printed circuit board.

2. The circuit board organization of claim 1, wherein the opening in said first printed circuit board is bounded by edges of said first printed circuit board.

3. The circuit board organization of claim 2, wherein said socket module includes a structural portion bounded by edges thereof dimensioned to overlay at least some portion of the edges of the opening on the front side of said printed circuit board.

4. The circuit board organization of claim 2, wherein said socket module includes a structural portion bounded by edges thereof dimensioned to overlay at least some portion of the edges of the opening on the back side of said printed circuit board.

5. The circuit board organization of claim 2, wherein said socket module includes a structural portion bounded by edges thereof dimensioned to be spaced from at least some portion of the edges of the opening of said printed circuit board by some clearance dimension.

6. The circuit board organization of claim 1, wherein said first and second circuit boards are detachably attached via at least one electrical connector having first and second parts.

7. The circuit board organization of claim 1, wherein said first and second circuit board are detachably attached via at least one electrical connector having a first part having conductive pins and a second part having sockets for receiving said pins of said first part.

8. The circuit board organization of claim 1, wherein said first and second circuit boards are detachably attached via at least first and second electrical connector pairs, each pair having first part having conductive pins and a second part having sockets for receiving said pins of said first part.

9. The circuit board organization of claim 1, wherein said socket module is detachably attached to said second printed circuit board via at least one electrical connector having first and second parts.

10. The circuit board organization of claim 1, wherein said socket module is detachably attached to said second printed circuit board via at least one electrical connector having a first part having conductive pins and a second part having sockets for receiving said pins of said first part.

11. The circuit board organization of claim 1, wherein said socket module is detachably attached to said second printed circuit board by at least first and second electrical connector pairs, each connector pair having a first part having conductive pins and a second part having sockets for receiving said pins of said first part.

12. A printed circuit board assembly for the testing of electronic components using a testing machine of the type having plural electrical contactors to at least establish electrical connection with a corresponding plurality of electrical contacts on the printed circuit board assembly to impress electrical test values onto at least some of the plurality of electrical contacts on the printed circuit board assembly and to receive electrical responses from at least some of the plurality of electrical contacts on the printed circuit board assembly, comprising, a first printed circuit board having a front side and a back side and having at least one opening there through from the front side to the back side, the opening defined by perimeter edges, a plurality of electrical contacts on at least the front side of said first printed circuit board thereof for receiving respective electrical contactors of a testing machine for establishing electrical connection therebetween;

a second printed circuit board detachably attached to at least a portion of the back side of said first printed circuit board such that at least a surface area of said second printed board is accessible through said at least one opening of said first printed circuit board;

a socket module having a test socket thereon for receiving a device-under-test, the test socket having plural electrical contacts for establishing an electrical connection with corresponding electrical contacts on a device-under-test when a device-under-test is electrically mated therewith;

said first printed circuit board having electrically conductive pathways thereon or therein connected to respective ones of said plurality of electrical contacts of said first printed circuit board;

said socket module having electrically conductive pathways thereon or therein connected to respective ones of said plural electrical contacts of said test socket;

said second printed circuit board having electrically conductive pathways thereon or therein;

a first electrical connector arrangement having a first part and a second part, the first part electrically connected to said electrically conductive pathways of the first printed circuit board, said second part of said first electrical connector arrangement electrically connected to said electrically conductive pathways of the second printed circuit board;

a second electrical connection arrangement having a first part and a second part, the first part of said second electrical connection arrangement electrically connected to said electrically conductive pathways of said socket module and said second part of said second electrical connector arrangement electrically connected to said first electrical connector arrangement electrically connected to said electrically conductive pathways of the second printed circuit board, whereby at least some of said plural electrical contacts of said test socket are in-circuit with at least some of said plurality of electrical contacts on said first printed circuit board.

13. The circuit board organization of claim 12, wherein said socket module includes a structural portion bounded by edges thereof dimensioned to overlay at least some portion of the edges of the opening on the front side of said printed circuit board.

14. The circuit board organization of claim 12, wherein said socket module includes a structural portion bounded by edges thereof dimensioned to overlay at least some portion of the edges of the opening on the back side of said printed circuit board.

15. The circuit board organization of claim 12, wherein said socket module includes a structural portion bounded by edges thereof dimensioned to be spaced from at least some portion of the edges of the opening of said printed circuit board by some clearance dimension.

* * * * *